(12) United States Patent
Pi (10) Patent No.: US 10,148,275 B1
(45) Date of Patent: Dec. 4, 2018

(54) LOW POWER DIGITAL-TO-ANALOG CONVERTER (DAC)-BASED FREQUENCY SYNTHESIZER

(71) Applicant: Deyi Pi, Laguna Niguel, CA (US)

(72) Inventor: Deyi Pi, Laguna Niguel, CA (US)

( * ) Notice: Subject to any disclaimer, the term of this patent is extended or adjusted under 35 U.S.C. 154(b) by 61 days.

(21) Appl. No.: 15/249,454

(22) Filed: Aug. 28, 2016

(51) Int. Cl.
| | |
|---|---|
| *H03L 7/197* | (2006.01) |
| *H03M 1/66* | (2006.01) |
| *H03L 7/10* | (2006.01) |
| *H03L 7/08* | (2006.01) |

(52) U.S. Cl.
CPC .......... *H03L 7/1974* (2013.01); *H03L 7/0802* (2013.01); *H03L 7/104* (2013.01); *H03M 1/662* (2013.01)

(58) Field of Classification Search
CPC ....... H03L 7/0802; H03L 7/104; H03L 7/197; H03L 7/1974; H03M 1/662
See application file for complete search history.

(56) References Cited

U.S. PATENT DOCUMENTS

| | | | | |
|---|---|---|---|---|
| 8,994,422 | B2 * | 3/2015 | Yao | H03L 7/18 327/150 |
| 9,300,307 | B2 * | 3/2016 | Juneau | H03L 7/18 |
| 9,564,913 | B1 * | 2/2017 | Courcy | H04L 7/033 |

* cited by examiner

*Primary Examiner* — Patrick O Neill (57) ABSTRACT

Various embodiments of fractional-N phase-locked loop (PLL) frequency synthesizers based on digital-to-analog conversion (DAC) are disclosed. In some embodiments, a PLL frequency synthesizer includes a phase-frequency detector, a voltage controlled oscillator (VCO) coupled to the phase-frequency detector, and a digital-to-analog converter (DAC) coupled between an input of the phase-frequency detector and an output of the VCO within a feedback path of the PLL frequency synthesizer. The phase-frequency detector is configured to receive a reference input clock and an output signal of the DAC as a feedback input clock. Furthermore, the DAC receives an output clock from the VCO and a digital control signal comprising frequency and phase information for synthesizing the feedback input clock. The disclosed DAC-based PLL frequency synthesizers do not require any frequency divider in a feedback path of the PLL, thereby significantly reducing power consumption and noise levels.

17 Claims, 6 Drawing Sheets

PLL FREQUENCY SYNTHESIZER 400

Prior Art

LOW POWER DIGITAL-TO-ANALOG CONVERTER (DAC)-BASED FREQUENCY SYNTHESIZER

TECHNICAL FIELD

The present disclosure generally relates to the field of frequency synthesis for electronic devices, and more specifically to systems and techniques for designing a low power, low noise digital-to-analog (DAC)-based fractional-N frequency synthesizer.

BACKGROUND

Modern computing systems have become increasingly more powerful because integrated circuit (IC) chips within these computer systems are operating at increasingly faster clock frequencies. At the same time, these IC chips also consume more power due to these faster clock frequencies. However, in many computing environments, it is desirable to reduce power consumption, for example, in mobile computing systems.

Clock frequencies used by a wide range of electronic systems, such as mobile phones, laptop computers, tablets, and GPS are often generated by a phase-locked loop (PLL) frequency synthesizer. A PLL frequency synthesizer can combine frequency multiplication, frequency division, and frequency mixing operations to produce a wide range of desired clock frequencies.

In common PLL frequency synthesizer designs, one or more frequency dividers are often included in the feedback path of a PLL frequency synthesizer. In particular, to obtain fine granularity of fractional frequencies, multiple frequency dividers or multi-modulus dividers are often used. This type of PLL frequency synthesizers includes sigma-delta modulator (SDM)-based fractional-N PLL frequency synthesizers (see FIG. 1) and phase interpolator (PI)-based fractional-N PLL frequency synthesizers (see FIG. 2). Both SDM-based PLL frequency synthesizers and PI-based PLL frequency synthesizers require using one or more frequency dividers to generate feedback clock signals. In applications where frequency division value N is high, multiple stages of frequency dividers are often required, which leads to high power consumption and noise contribution from these frequency dividers.

SUMMARY

Described herein are various embodiments of fractional-N phase-locked loop (PLL) frequency synthesizers based on digital-to-analog conversion (DAC). The proposed DAC-based fractional-N PLL frequency synthesizers do not require any frequency divider in a feedback path of the PLL to generate the feedback clock signal for the phase-frequency detector, thereby significantly reducing power consumption and noise levels. Furthermore, the proposed DAC-based fractional-N PLL frequency synthesizer uses a gated-DAC design such that the DAC module only operates in controlled time intervals instead of operating full time. As a result, the power consumption and noise level associated with the DAC module have both been greatly reduced. Consequently, the disclosed fractional-N PLL frequency synthesizer can achieve very high precision at low power consumption and noise levels.

In one aspect, phase-locked loop (PLL) frequency synthesizer is disclosed. This PLL frequency synthesizer includes a phase-frequency detector, a voltage controlled oscillator (VCO) coupled to the phase-frequency detector, and a digital-to-analog converter (DAC) coupled between an input of the phase-frequency detector and an output of the VCO within a feedback path of the PLL frequency synthesizer. The phase-frequency detector is configured to receive a reference input clock and an output signal of the DAC as a feedback input clock and compare the reference input clock with the feedback input clock. Furthermore, the DAC is configured to receive an output clock from the VCO as a reference and a digital control signal comprising frequency and phase information for synthesizing the feedback input clock and output the synthesized feedback input clock.

In some implementations, the PLL frequency synthesizer further includes a frequency/phase generator coupled to an input of the DAC. In some embodiments, this frequency/phase generator receives a clock synthesis control word and generates the digital control signal.

In some implementations, the PLL frequency synthesizer further includes a nonlinear compensation module coupled between the frequency/phase generator and the DAC. In some embodiments, the nonlinear compensation module receives the digital control signal from the frequency/phase generator and outputs a pre-compensated digital control signal which includes a pre-compensation for a nonlinearity distortion in the synthesized feedback input clock caused by the DAC.

In some implementations, when synthesizing the feedback input clock, the DAC is configured to operate only during selected time internals when clock transition regions of the feedback input clock are being synthesized.

In some implementations, the clock transition regions include rising clock transition regions and falling clock transition regions.

In some implementations, the DAC operates during the selected time internals by clock gating the DAC using the digital control signal.

In some implementations, clock gating the DAC using the digital control signal includes setting the digital control signal to a specific value to disable the DAC when non-clock transition regions of the feedback input clock are synthesized.

In some implementations, the non-clock transition regions include logic-low time periods and logic-high time periods.

In some implementations, the DAC is further configured to synthesize the feedback input clock at a frequency between N times the frequency of the output clock and N+1 times the frequency of the output clock to perform a fractional-N frequency synthesis, wherein N is an integer.

In some implementations, the DAC is configured to perform the fractional-N frequency synthesis based on the digital control signal.

In some implementations, the DAC is configured to perform the fractional-N frequency synthesis without using a frequency divider.

In some implementations, the feedback path of the PLL frequency synthesizer does not include a frequency divider.

In some implementations, the DAC consumes significantly less power than a DAC in a digital direct frequency synthesizer (DDFS) which operates full time. Furthermore, the DAC requires significantly lower sampling rate than a DAC in a DDFS which operates full time.

In some implementations, the PLL frequency synthesizer further includes a charge pump and a low pass filter coupled between the phase-frequency detector and the VCO.

In some implementations, the PLL frequency synthesizer further includes a set of output frequency dividers coupled to an output of the VCO and configured to divide the output clock of the VCO by a set of predetermined division factors.

In another aspect, a gated digital-to-analog converter (gated-DAC) is disclosed. This gated-DAC includes a DAC control module configured to generate a periodic DAC control signal; a DAC module coupled to the DAC control module to receive the periodic DAC control signal; and a multiplexor that includes multiple signal inputs and a selection input for selecting one of the multiple signal inputs as an output of the multiplexor, wherein a first signal input of the multiple signal inputs is coupled to an output of the DAC module. In some embodiments, a period of the periodic DAC control signal includes a first set of time intervals which comprises active control signals for controlling an operation of the DAC module and a second set of time intervals which comprises a signal value for disabling the DAC module.

In some implementations, a second signal input of the multiple signal inputs is coupled to a logic low and a third signal input of the multiple signal inputs is coupled to a logic high.

In some implementations, the DAC module uses the active control signals to generate clock transitions during an operation to synthesize a clock signal.

In some implementations, the selection input is configured to select the first signal input when the DAC module operates to generate the clock transitions.

In some implementations, the selection input is configured to select either the first signal input or the second signal input when the DAC module is disabled.

In some implementations, the DAC module does not consume power or consume little power during the second set of time intervals.

In some implementations, the gated-DAC is used in a feedback path of a PLL frequency synthesizer in place of a frequency divider.

In some implementations, the gated-DAC is used in a feedback path of a PLL frequency synthesizer in place of a multi-modulus divider to perform a fractional-N frequency synthesis.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

Features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without these specific details. In some instances, structures and components are shown in block diagram form in order to avoid obscuring the concepts of the subject technology.

Described herein are various embodiments of fractional-N phase-locked loop (PLL) frequency synthesizers based on digital-to-analog conversion (DAC). The proposed DAC-based fractional-N PLL frequency synthesizers do not require any frequency divider in a feedback path of the PLL to generate the feedback clock signal for the phase-frequency detector, thereby significantly reducing power consumption and noise levels. Furthermore, the proposed DAC-based fractional-N PLL frequency synthesizer uses a gated-DAC design such that the DAC module only operates in controlled time intervals instead of operating full time. As a result, the power consumption and noise level associated with the DAC module have both been greatly reduced. Consequently, the disclosed fractional-N PLL frequency synthesizer can achieve very high precision at low power consumption and noise levels.

In one aspect, phase-locked loop (PLL) frequency synthesizer is disclosed. This PLL frequency synthesizer includes a phase-frequency detector, a voltage controlled oscillator (VCO) coupled to the phase-frequency detector, and a digital-to-analog converter (DAC) coupled between an input of the phase-frequency detector and an output of the VCO within a feedback path of the PLL frequency synthesizer. The phase-frequency detector is configured to receive a reference input clock and an output signal of the DAC as a feedback input clock and compare the reference input clock with the feedback input clock. Furthermore, the DAC is configured to receive an output clock from the VCO as a reference and a digital control signal comprising frequency and phase information for synthesizing the feedback input clock and output the synthesized feedback input clock.

In another aspect, a gated digital-to-analog converter (gated-DAC) is disclosed. This gated-DAC includes a DAC control module configured to generate a periodic DAC control signal; a DAC module coupled to the DAC control module to receive the periodic DAC control signal; and a multiplexor that includes multiple signal inputs and a selection input for selecting one of the multiple signal inputs as an output of the multiplexor, wherein a first signal input of the multiple signal inputs is coupled to an output of the DAC module. In some embodiments, a period of the periodic DAC control signal includes a first set of time intervals which comprises active control signals for controlling an operation of the DAC module and a second set of time intervals which comprises a signal value for disabling the DAC module.

Figure 1:
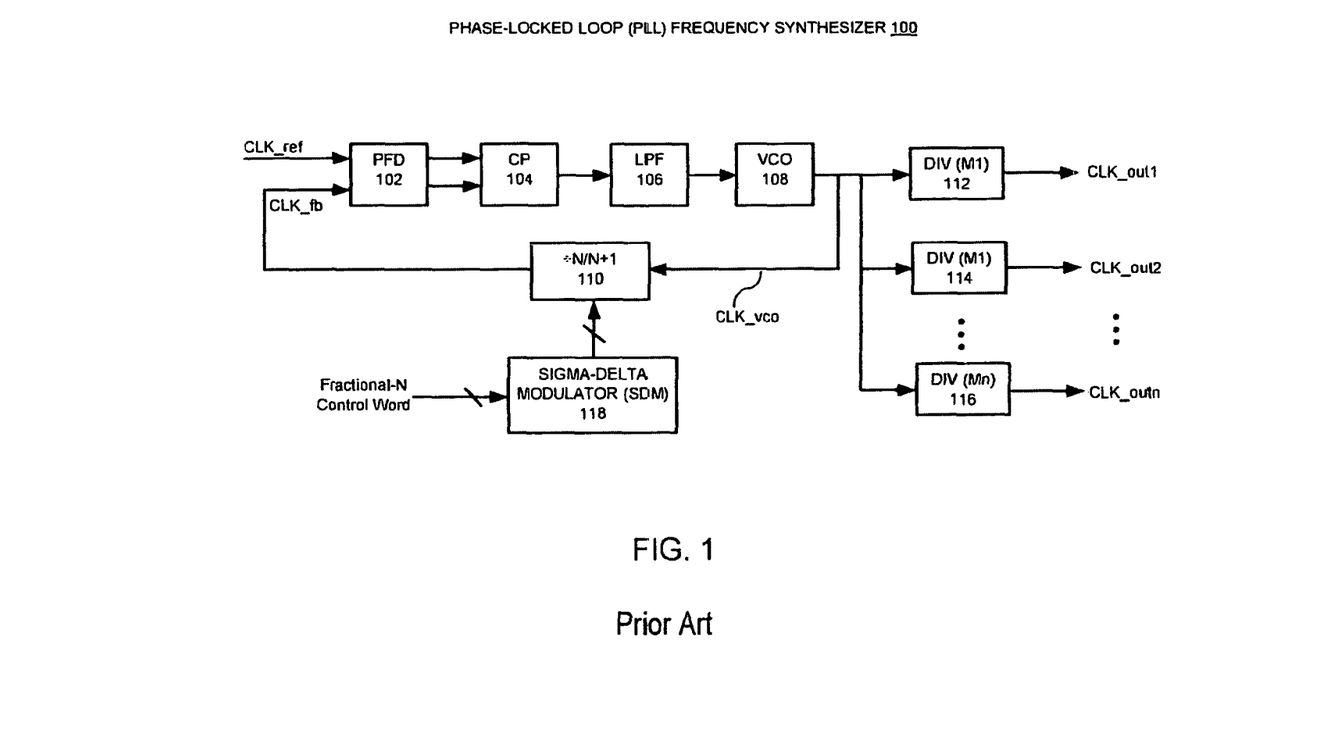
FIG. 1 illustrates a schematic diagram of an exemplary sigma-delta modulator (SDM) fractional-N PLL frequency synthesizer (FS).

FIG. 1 illustrates a schematic diagram of an exemplary sigma-delta modulator (SDM) fractional-N phase-locked loop (PLL) frequency synthesizer (FS) 100. As can be seen in FIG. 1, PLL FS 100 includes a phase-frequency detector (PFD) 102, a charge pump (CP) 104, a low pass filter (LPF) 106, and a voltage controlled oscillator (VCO) 108. PLL FS 100 receives a reference clock frequency input (CLK_ref) at an input of PFD 102 and generates an output clock frequency (CLK_vco) from an output of VCO 108. PLL FS 100 also includes a fractional-N module in the form of a dual modulus divider 110. Dual modulus divider 110 is coupled between the output of VCO 108 and a feedback input of PFD 102 and is constructed using two integer dividers, i.e., a divide-by-N divider and a divide-by-(N+1) frequency divider. Typically, a controller coupled to dual modulus divider (DMD) 110 controls the divider value of dual modulus divider 110 to alternate between N and N+1 so that the feedback input clock (CLK_fb) to PFD 102 alternates between two frequency values of CLK_vco/N and CLK_vco/(N+1). As a result, the output of VCO 108 CLK_vco also alternates between two locked frequency values. The effective output frequency of VCO 108 is determined by a time-averaged ratio of the two locked frequencies corresponding to the two divider values, and as such, dual-modulus PLL FS 100 can achieve a very fine granularity of fractional frequencies. In the particular embodiment of PLL FS 100, PLL FS 100 also includes a number of output frequency dividers DIV1 112, DIV2 114, . . . , DIVn 116, which are configured to divide the output clock CLK_vco of VCO 108 by a set of predetermined factors M1, M2, . . . , Mn and generate a set of final frequency outputs CLK_out1, CLK_out2, . . . , CLK_outn. Note that PLL FS 100 depicts just one sample implementation of SDM-based fractional-N PLL frequency synthesizer, while other implementations of SDM-based fractional-N PLL frequency synthesizer may have greater or fewer components than the one shown in FIG. 1 without departing for the scopes of the present disclosure.

If the control sequence of alternating between divide-by-N and divide-by-(N+1) is periodic, spurious signals appear in the VCO 108 output in addition to the desired frequency. A sigma-delta modulator (SDM) 118 is used to mitigate this problem by randomizing the selection of divide-by-N and divide-by-(N+1), while maintaining the time-averaged ratio of divide-by-N and divide-by-(N+1). Some advantages of using a SDM DMD PLL frequency synthesizer such as PLL FS 100 include: (1) low impact on design complexity as a result of the increased accuracy in the fractional frequency output; (2) low sensitivity to processing techniques thereby the ability to quickly migrate in response to different manufacturing processes; and (3) the ability to suppress quantization noise within a low frequency band. However, SDM DMD PLL FS 100 can also suffer from the following disadvantages: (1) the complexity in system design; (2) the necessity of using a multimode divider, which limits the range of output frequency; (3) high frequency quantization noise will be amplified, which needs to be suppressed by using a low-bandwidth PLL; and (4) the nonlinearity of PLL can reduce the effectiveness of quantization noise suppression within the low-frequency band of the sigma-delta modulator.

Figure 2:
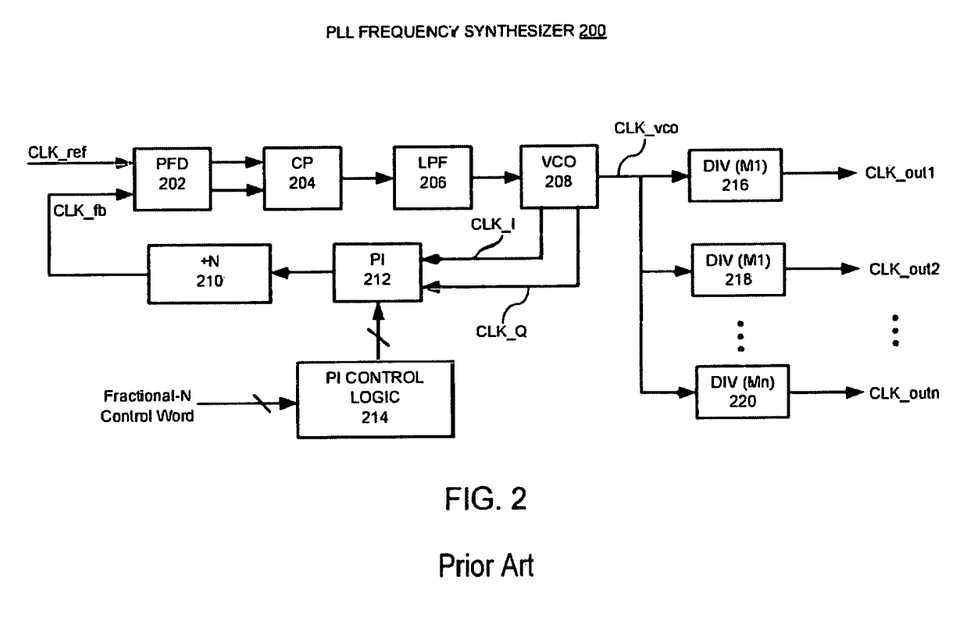
FIG. 2 illustrates a schematic diagram of an exemplary phase interpolator (PI)-based fractional-N PLL frequency synthesizer (FS).

FIG. 2 illustrates a schematic diagram of an exemplary phase interpolator (PI)-based fractional-N PLL frequency synthesizer (FS) 200. As can be seen in FIG. 2, PLL FS 200 includes a PFD 202, a CP 204, a LPF 206, and VCO 208. PLL FS 200 receives a reference clock frequency input (CLK_ref) at an input of PFD 202 and generates an output clock frequency (CLK_vco) from an output of VCO 208. Instead of using a dual modulus divider or any other multi-modulus divider as in PLL FS 100, PLL FS 200 uses a single modulus divider (SMD) (divided-by-N) 210. To achieve the result of fractional-N at the VCO output, a phase interpolator (PI) 212 in PLL FS 200 is used in place of SDM 118 in PLL FS 100. More specifically, the output of VCO 208 CLK_vco is separated into two orthogonal components: an in-phase component CLK_I and a quadrature component CLK_Q, which are used by PI 212 to generate an array of interpolated phases of fine granularity. By choosing a desired phase among the array of interpolated phases using a PI control logic 214, a desired fractional division and hence a desired fractional frequency output can be achieved. Similar to PLL FS 100, PLL FS 200 also includes a number of output frequency dividers DIV1 216, DIV2 218, . . . , DIVn 220, which are configured to divide the output of VCO 208 CLK_vco by a set of predetermined factors M1, M2, . . . , Mn and generate a set of final frequency outputs CLK_out1, CLK_out2, . . . , CLK_outn. Note that PLL FS 200 depicts just one sample implementation of PI-based fractional-N PLL frequency synthesizer, while other implementations of PI-based fractional-N PLL frequency synthesizer may have greater or fewer components than the one shown in FIG. 2 without departing for the scopes of the present disclosure.

Some advantages of using a PI-based SMD PLL frequency synthesizer such as PLL FS 200 include: (1) simple system structure; (2) using a single modulus divider instead of a multi-modulus divider; and (3) simple control logic. However, PI-based SMD PLL FS 200 can also suffer from the following disadvantages: (1) improvement difficulty as a result of a high-correlation between phase interpolation precision and PI design complexity; (2) different processing techniques requires redesign of the PI module; (3) high sensitivity to manufacturing processes and mismatches; and (4) the need for using a multi-phase VCO in conjunction with the PI module.

Note that both the SDM-based fractional-N PLL frequency synthesizer and the PI-based fractional-N PLL frequency synthesizer described above require using one or more frequency dividers to generate feedback clock signals. In applications where frequency division value N is high, multiple stages of frequency dividers need to be used, which leads to high power consumption and noise contribution from these frequency dividers.

Figure 3:
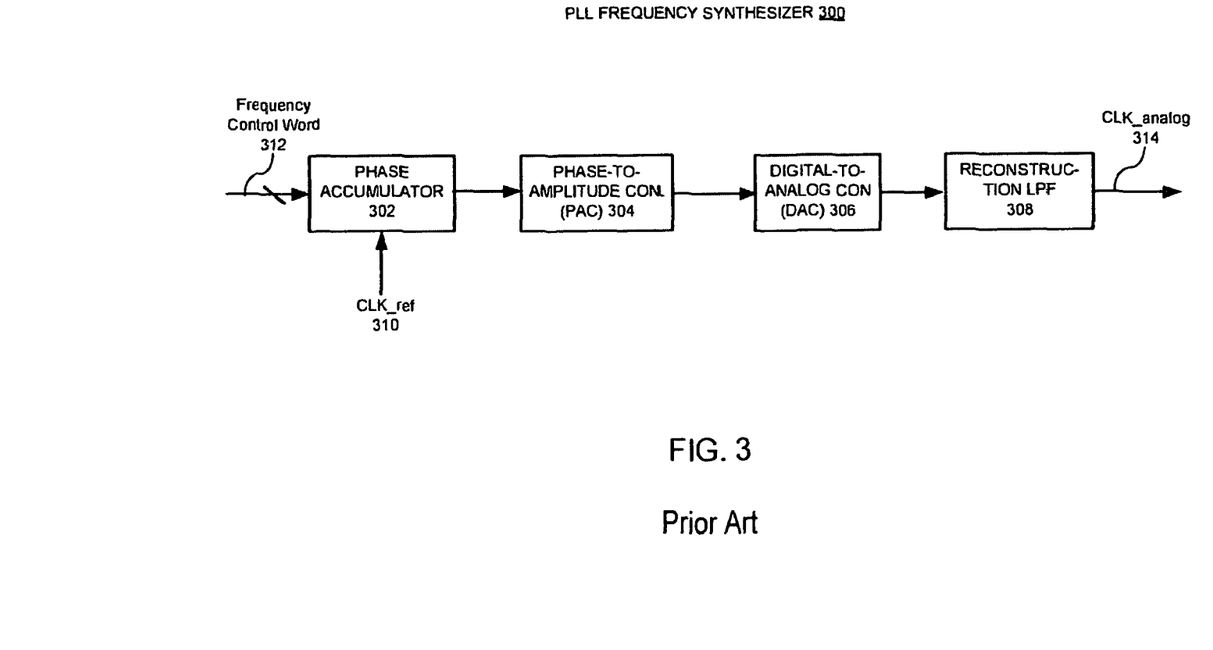
FIG. 3 illustrates a schematic diagram of an exemplary digital direct frequency synthesizer (DDFS).

FIG. 3 illustrates a schematic diagram of an exemplary digital direct frequency synthesizer (DDFS) 300. As can be seen in FIG. 3, DDFS 300 includes a phase accumulator 302, a phase-to-amplitude converter (PAC) 304, a digital-to-analog converter (DAC) 306, and a reconstruction low-pass filter (LPF) 308. DDFS 300 receives a reference clock frequency (CLK_ref) 310 at a first input of phase accumulator 302, which additionally receives a frequency control word 312 at a second input of phase accumulator 302. Phase accumulator 302 generates a discrete-time, quantized modulo-$2^N$ sawtooth waveform, the period of which is controlled by frequency control word 312, wherein N is the number of bits carried in phase accumulator 302 which determines the frequency resolution. The output waveform of phase accumulator 302 is then converted by PAC 304 to a sampled sinusoid wave, which is then converted to an analog waveform by DAC 306. Finally, reconstruction LPF 308 is used to reject the spectral replicas in the analog waveform produced during the analog conversion process by DAC 306 and outputs an analog clock signal CLK_analog 314. Some advantages of using a digital direct frequency synthesizer such as DDFS 300 include great frequency agility which allows for instantaneous frequency response with a change of value of frequency control word 312. However, DDFS 300 can also suffer from the following disadvantages: (1) need for a full-time operation of DAC 306 leading to high perform requirement on DAC 306 and also high power consumption; and (2) the difficulty to increase the output frequency.

It is observed that frequency dividers in PLL-based frequency synthesizers can be both a major contributor to power consumption and noise level. Hence, if PLL frequency synthesizers can be constructed without frequency dividers, both power consumption level and noise level may be significantly reduced.

Figure 4:
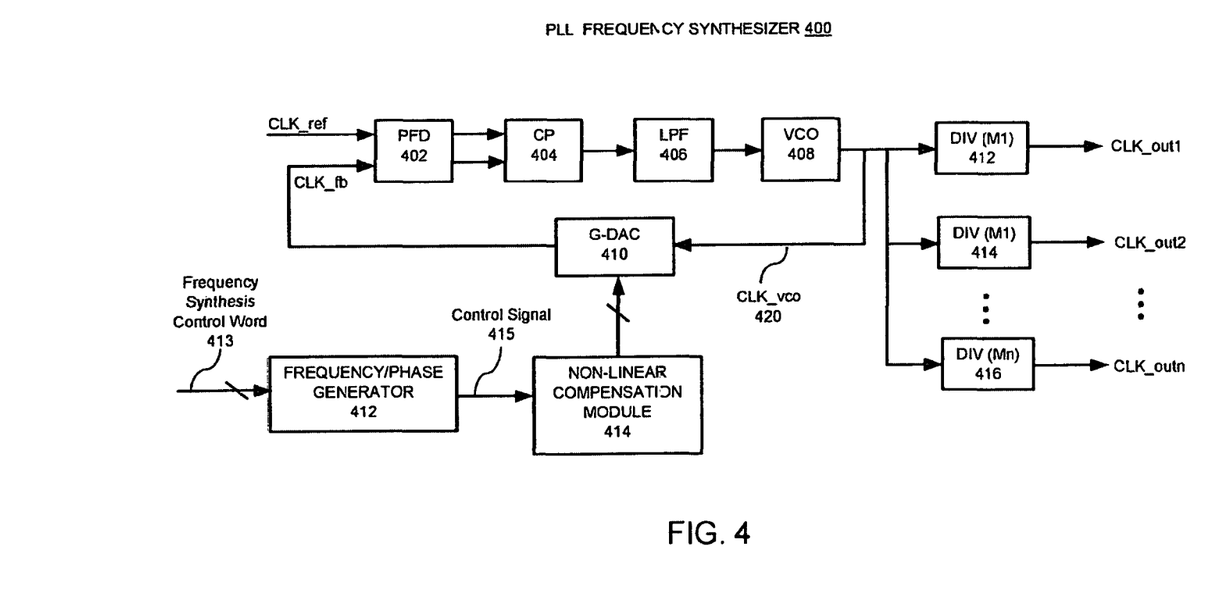
FIG. 4 illustrates a schematic diagram of an exemplary digital-to-analog converter (DAC)-based fractional-N PLL frequency synthesizer (FS) in accordance with some embodiments described herein.

FIG. 4 illustrates a schematic diagram of an exemplary DAC-based fractional-N PLL frequency synthesizer (FS) 400 in accordance with some embodiments described herein. Not all of the depicted components may be used, however, and one or more implementations may include additional components not shown in the figure. Variations in the arrangement and type of the components may be made without departing from the scope of the subject technology. Additional components, different components, or fewer components may be provided.

As can be seen in FIG. 4, PLL FS 400 includes a PFD 402, a CP 404, a LPF 406, and VCO 408. PLL FS 400 receives a reference clock frequency input (CLK_ref) at an input of PFD 402 and generates an output clock frequency (CLK_vco) 420 from an output of VCO 408. PLL FS 400 also includes a gated-DAC (or "G-DAC" hereinafter) 410 which is configured to only operates during selected durations of times (instead of operating all the time) for processing frequency and phase information. Note that G-DAC 410 has replaced the conventional frequency dividers to form the disclosed fractional-N frequency synthesizer which does not include a conventional frequency divider.

PLL FS 400 also includes a frequency/phase generator 412 which receives clock synthesis control word 413 and generates a control signal 415 for G-DAC 410. In some embodiments, the generated control signal 415 includes frequency and phase information for synthesizing the feedback clock signal CLK_fb. In some embodiments, control signal 415 is a digital signal. Further referring to FIG. 4, control signal 415 containing the frequency and phase information is the input to a nonlinear compensation module 414. In some embodiments, the output of G-DAC 410 includes clock transitions converted from amplitude signals, and the process of converting the amplitudes to the phases of the clock transitions can lead to non-linear distortion. In some embodiments, nonlinear compensation module 414 is configured to pre-compensate for the inherent nonlinearity distortion associated with G-DAC 410 prior to the amplitude-phase conversion performed by G-DAC 410. For example, nonlinear compensation module 414 may use a pre-distortion compensation algorithm stored within nonlinear compensation module 414. More specifically, the pre-distortion compensation algorithm may be used to apply a correct amount of offset nonlinear distortion in the frequency and phase information which is in the opposite direction of a predict amount of nonlinearity distortion caused by G-DAC 410. In some embodiments, nonlinear compensation module 414 includes a pre-computed look-up table containing pre-computed nonlinear distortion offset values. Nonlinear compensation module 414 receives control signal 415 containing the frequency and phase information in the form of a set of digital bus signals. Based on the digital received frequency and phase information, nonlinear compensation module 414 searches the look-up table for the correct pre-computed nonlinear distortion offset values, which are combined with the received frequency and phase information to generate the pre-compensate frequency and phase information as the input to G-DAC 410.

G-DAC 410 receives the control signal including the pre-compensated frequency and phase information from nonlinear compensation module 414, and uses this information to synthesize the feedback clock signal CLK_fb. Note that because of the elimination of frequency dividers in PLL FS 400, the frequency and phase information required to synthesize a fractional-N feedback clock signal CLK_fb of VCO output CLK_vco can now be received from the frequency synthesis control word 413 in the digital domain in collaboration of G-DAC. When properly designed, the offset nonlinear distortion in the pre-compensated phase information can precisely cancel out the nonlinearity distortion caused by G-DAC 410, and as such, the synthesized feedback clock signal CLK_fb is a precise representation of the intended frequency and phase information in the frequency synthesis control word 413. Finally, the synthesized feedback clock signal CLK_fb is fed into PFD 402 and used by PLL FS 400 to produce the desired clock signal output.

Note that PFD 402 in PLL FS 400 is typically only sensitive to phase information associated with the clock edges/transitions. Based on the above observation, in some embodiments, G-DAC 410 is configured such that it operates to process frequency and phase information only during time internals when the clock transitions need to be synthesized. In contrast to a conventional DAC in a PLL FS which is configured to operate all the time, the disclosed G-DAC 410 is only active to operate part of the time for each clock period to be synthesized. As a result, the proposed DAC within PLL FS 400 requires a significantly lower sampling rate, e.g., one which is much lower than CLK_vco 420 frequency, thereby significantly reducing both power consumption and design complexity.

In the particular embodiment of PLL FS 400, PLL FS 400 also includes a number of output frequency dividers DIV1 412, DIV2 414, . . . , DIVn 416, which are configured to divide the output clock signal CLK_vco 420 by a set of predetermined factors M1, M2, . . . , Mn and generate a set of final frequency outputs CLK_out1, CLK_out2, . . . , CLK_outn. Note that PLL FS 400 depicts just one sample implementation of the proposed gated-DAC fractional-N PLL frequency synthesizer, while other implementations of the proposed gated-DAC fractional-N PLL frequency synthesizer may have greater or fewer components than the one shown in FIG. 4 without departing for the scopes of the present disclosure.

Figure 5A:
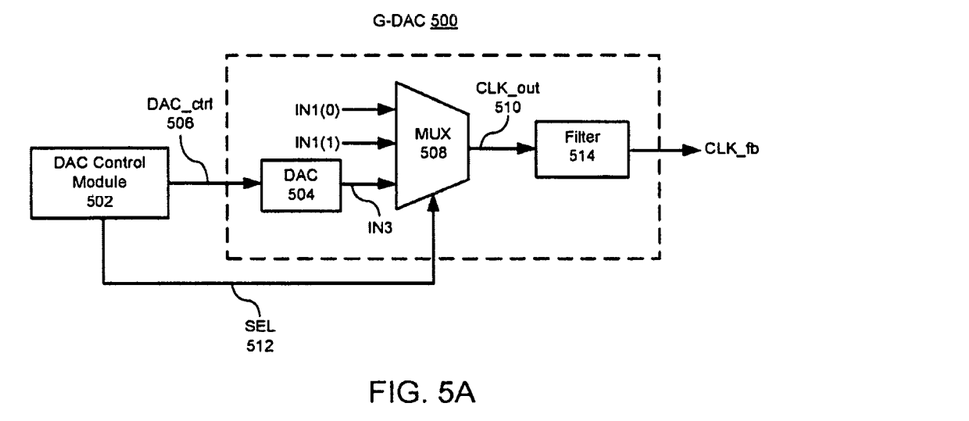
FIG. 5A illustrates a schematic diagram of a G-DAC which is an exemplary implementation of the G-DAC in FIG. 4 in accordance with some embodiments described herein.

FIG. 5A illustrates a schematic diagram of a G-DAC 500 which is an exemplary implementation of G-DAC 410 in PLL FS 400 in accordance with some embodiments described herein. As can be seen in FIG. 5A, G-DAC 510 includes a DAC control module 502 which is configured to convert the pre-compensated frequency and phase information received from nonlinear compensation module 414 into a DAC control signal DAC_ctrl 506. Note that DAC control module 502 additionally generates an output signal "SEL" 512. In some embodiments, each time when the received pre-compensated frequency and phase information corresponds to a clock transition (e.g., including both rising and falling transitions), DAC control module 502 generates a value for the selection signal SEL 512 which is configured to select the output of DAC 504 as the output of MUX 508 (more detail of the operations of DAC 504 and MUX 508 is described below).

G-DAC 500 also includes DAC 504 which performs the main clock synthesis function. More specifically, DAC 504 receives control signal DAC_ctrl 506 including the pre-compensated frequency and phase information and synthesizes the pre-compensated frequency and phase information into parts of the feedback clock signal CLK_fb in the regions of the clock transitions of CLK_fb. As is described in more detail below, DAC 504 is only enabled and operates when there is an active input signal DAC_ctrl 506. In some embodiments, the active input signal DAC_ctrl 506 corresponds to clock transitions. In some embodiments, when DAC_ctrl 506 is not active, DAC_ctrl 506 is set to a value to disable DAC 504. As a result, DAC 504 does not operate in full time.

G-DAC 500 additionally includes multiplexor (MUX) 508, which receives at least three input signals, i.e., IN1: a constant signal level "0"; IN2: a constant signal level "1"; and IN3: the output of DAC 504, and outputs a synthesized clock signal CLK_out 510. MUX 508 includes the aforementioned signal select input "SEL" 512 which is configured to select one of IN', IN2, and IN3. More specifically, for each clock period of CLK_out 510 to be synthesized, SEL 512 selects IN1 to generate a logic low level "0", IN2 to generate a logic high level "1", and IN3 to generate the two clock transitions.

G-DAC 500 also includes a filter 514 which is coupled to the output of MUX 508 for filtering the synthesized clock signal CLK_out 510 and generating the final feedback clock signal CLK_fb. Note that the clock transitions generated by DAC 504 are typically discrete and piecewise constant or staircase-shaped which can only represent limited phase information. By applying filter 514, the discrete and piecewise constant clock transitions output from DAC 504 can be "smoothed out" to generate desired smooth continuous clock transitions in CLK_fb, thereby ensuring that the phase of CLK_fb can change smoothly and continuously.

Figure 5B:
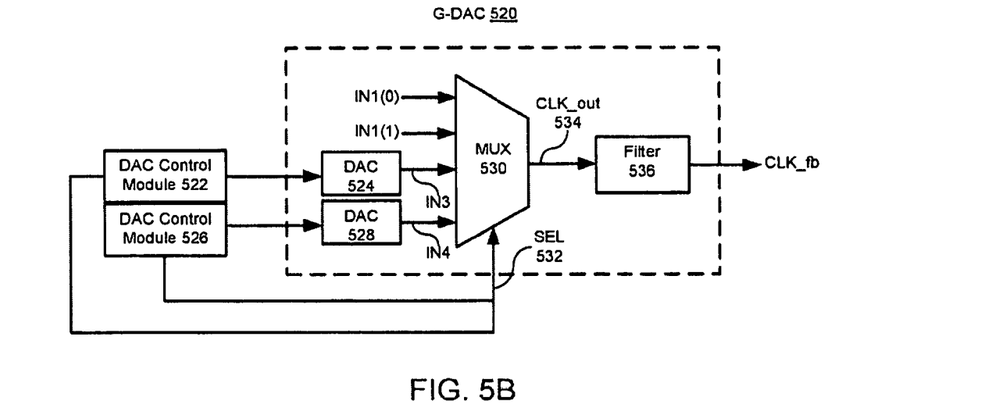
FIG. 5B illustrates a schematic diagram of a G-DAC which is another exemplary implementation of the G-DAC in FIG. 4 in accordance with some embodiments described herein

Note that if multiple DACs are used in a G-DAC instead of a single DAC as shown in the embodiment of FIG. 5A, it is possible to reduce the performance requirement on each of the multiple DACs. FIG. 5B illustrates a schematic diagram of a G-DAC 520 including two DACs as another implementation of G-DAC 410 in PLL FS 400 in accordance with some embodiments described herein. Comparing to G-DAC 500, G-DAC 520 is configured to expand the DAC portion of the circuit into two parallel branches: a first DAC branch including a first DAC control module 522 coupled to a first DAC 524; and a second DAC branch including a second DAC control module 526 coupled to a second DAC 528. As such, a MUX 530 now has four inputs: IN1: a constant signal level "0"; IN2: a constant signal level "1"; IN3: the output of DAC 524, and IN4: the output of DAC 528. MUX 530 uses a signal select input "SEL" 532 generated by both DAC control module 522 and DAC control module 526 to select one of the inputs IN1, IN2, IN3, and IN4, and outputs a synthesized clock signal CLK_out 534.

To better understand the difference between G-DAC 500 of FIG. 5A and G-DAC 520 of FIG. 5B, assuming 1024 phases are needed to synthesize CLK_out 534. In the embodiment of G-DAC 500 which uses a single DAC 504, a 10-bit DAC is required to generate these 1024 phases. In contrast, in the embodiment of G-DAC 520 which uses two DACs 524 and 528, each of the DACs only needs to maintain one half of the total number, i.e., 512 phases. Hence, DACs 524 and 528 can be 9-bit DACs of a lower resolution than that of DAC 504, thereby lowering complexity and performance requirement on the type of DACs that can be used in G-DAC 520. In some embodiments, when synthesizing a clock transition (e.g., a rising or a falling transition), both DACs 524 and 528 operate simultaneously and in collaboration with each other. A personal having ordinary skill in the art can appreciate that more than two DACs can be used in other embodiments of G-DAC 410 to further reduce complexity and performance requirement on each of the multiple DACs. However, a large number of DACs can also lead to a higher power consumption and greater chip area. Hence, an optimal number of DACs in an ideal G-DAC design may be determined based on a thorough evaluation of the tradeoff among power consumption, chip area, design complexity, and possibly additional factors. G-DAC 520 also includes a filter 536 which is coupled to the output of MUX 530 for filtering the synthesized clock signal CLK_out 534 and generating desired smooth continuous clock transitions in the final feedback clock signal CLK_fb.

Figure 6:
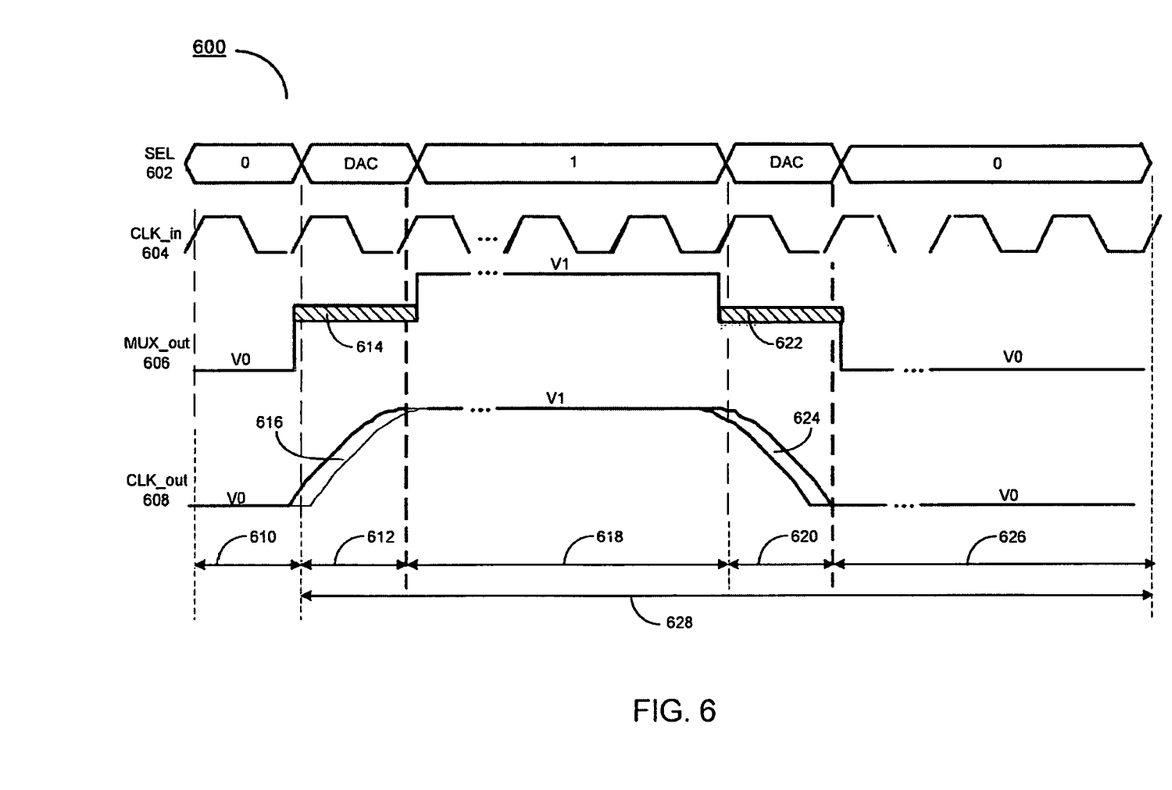
FIG. 6 presents a timing-diagram illustrating an exemplary clock synthesis operation of the G-DAC illustrated in FIG. 5A in accordance with some embodiments described herein.

FIG. 6 presents a timing-diagram 600 illustrating an exemplary clock synthesis operation of G-DAC 500 illustrated in FIG. 5A in accordance with some embodiments described herein. As can be seen in FIG. 6, timing-diagram 600 includes four waveforms: (1) SEL 602 as an example of SEL 512 in G-DAC 500; CLK in 604 as an example of the VCO output CLK_vco 420; MUX_out 606 as an example of MUX508 output CLK_out 510 in G-DAC 500; and CLK_out 608 as an example of filter 514 output CLK_fb in G-DAC 500. More specifically, SEL 602 first selects "0" or IN1 in a time region 610, and as a result, both MUX 606 and CLK_out 608 output a logic low level "V0". In some embodiments, during the time period of region 610, DAC_ctrl 506 is configured with a value so that DAC 504 is disabled and nonoperational. Next, SEL 602 selects "DAC" or IN3 in a time region 612 to generate a rising clock transition. As mentioned above, once DAC is selected, DAC 504 begins to process the DAC_ctrl 506 containing the compensated frequency and phase information. In the particular embodiment of FIG. 6, DAC 504 converts DAC_ctrl 506 into a rising clock transition. As can be seen, MUX_out 606 outputs a range of increasing voltage levels represented by a rectangular region 614 in MUX_out 606. Note that the range of voltage levels is bounded by the logic low voltage level V0 and a logic high voltage level "V1". After filtering by filter 514, the range of voltage levels 614 becomes a synthesized rising clock transition 616 within CLK_out 608.

Continuing referring to FIG. 6, SEL 602 next selects "1" or IN2 in a time region 618, and as a result, both MUX 606 and CLK_out 608 output the logic high voltage level V1. In some embodiments, during the time period of region 618, DAC_ctrl 506 is again configured with a value so that DAC 504 is disabled and nonoperational. Next, SEL 602 selects "DAC" or IN3 again in a time region 620 to generate a falling clock transition. Hence, DAC 504 is active again to process DAC_ctrl 506 containing the compensated frequency and phase information. In the particular embodiment of FIG. 6, DAC 504 converts DAC_ctrl 506 into a falling clock transition. As can be seen, MUX_out 606 outputs a range of decreasing voltage levels represented by a rectangular region 622 in MUX_out 606. Note that the range of voltage levels is bounded by the low voltage level V0 and the high voltage level V1. After filtering by filter 514, the range of voltage levels 622 becomes a synthesized falling clock transition 624 within CLK_out 608.

Finally in FIG. 6, SEL 602 again selects "0" or IN1 in a time region 626, and as a result, both MUX 606 and CLK_out 608 output the low voltage level V0. As can be seen, the combined regions of 612, 618, 620, and 626 form one complete synthesized clock period 628, which is many times longer than the clock period of CLK in 604. Because CLK_out 608 represents an intended fractional-N feedback clock signal based on CLK in 604 which is the output of VCO CLK_vco 420, the proposed DAC-based fractional-N PLL FS implements the fractional-N function of a PLL without using any frequency divider. As mentioned above, because of the elimination of frequency dividers, the frequency and phase information required to synthesize CLK_out 608 based on CLK in 604 can be received from the clock synthesis control word 413 in the digital domain.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product While this patent document contains many specifics, these should not be construed as limitations on the scope of any invention or of what may be claimed, but rather as descriptions of features that may be specific to particular embodiments of particular inventions. Certain features that are described in this patent document and attached appendix in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document and attached appendix should not be understood as requiring such separation in all embodiments.

Only a few implementations and examples are described and other implementations, enhancements and variations can be made based on what is described and illustrated in this patent document.

What is claimed is:

1. A phase locked loop (PLL) frequency synthesizer, comprising:
   a phase-frequency detector;
   a voltage controlled oscillator (VCO) coupled to the phase-frequency detector; and
   a gated digital-to-analog converter (G-DAC) coupled between an input of the phase-frequency detector and an output of the VCO within a feedback path of the PLL frequency synthesizer, wherein the VCO, the G-DAC and the phase-frequency detector are coupled to each other directly in a sequential order, and the G-DAC comprises:
   a first DAC control module configured to generate a first periodic DAC control signal;

a first DAC module coupled to the DAC control module to receive the first periodic DAC control signal; and a multiplexor that includes multiple signal inputs and a selection input for selecting one of the multiple signal inputs as an output of the multiplexor, wherein a first signal input of the multiple signal inputs is coupled to an output of the DAC module, wherein a period of the first periodic DAC control signal includes a first set of time intervals which comprises active control signals for controlling an operation of the first DAC module and a second set of time intervals which comprises a first signal value for disabling the first DAC module, and wherein the first DAC module is directly coupled to both the first DAC control module and the multiplexor, wherein the phase-frequency detector is configured to receive a reference input clock and an output signal of the G-DAC as a feedback input clock and compare the reference input clock with the feedback input clock; and wherein the G-DAC is configured to receive an output clock from the VCO as a reference and a digital control signal comprising frequency and phase information for synthesizing the feedback input clock and output the synthesized feedback input clock.

2. The PLL frequency synthesizer of claim 1, further comprising a frequency/phase generator coupled to an input of the G-DAC, wherein the frequency/phase generator receives a clock synthesis control word and generates the digital control signal.

3. The PLL frequency synthesizer of claim 2, further comprising a nonlinear compensation module coupled between the frequency/phase generator and the G-DAC, wherein the nonlinear compensation module receives the digital control signal from the frequency/phase generator and outputs a pre-compensated digital control signal which includes a pre-compensation for a nonlinearity distortion in the synthesized feedback input clock caused by the G-DAC.

4. The PLL frequency synthesizer of claim 1, wherein when synthesizing the feedback input clock, the G-DAC is configured to operate only during selected time internals when clock transition regions of the feedback input clock are being synthesized.

5. The PLL frequency synthesizer of claim 4, wherein the clock transition regions include rising clock transition regions and falling clock transition regions.

6. The PLL frequency synthesizer of claim 4, wherein the G-DAC operates during the selected time internals by clock gating the G-DAC using the digital control signal.

7. The PLL frequency synthesizer of claim 6, wherein clock gating the G-DAC using the digital control signal includes setting the digital control signal to a specific value to disable the G-DAC when non-clock transition regions of the feedback input clock are synthesized.

8. The PLL frequency synthesizer of claim 7, wherein the non-clock transition regions include logic-low time periods and logic-high time periods.

9. The PLL frequency synthesizer of claim 1, wherein the G-DAC is further configured to synthesize the feedback input clock at a frequency between N times the frequency of the output clock and N+1 times the frequency of the output clock to perform a fractional-N frequency synthesis, wherein N is an integer.

10. The PLL frequency synthesizer of claim 9, wherein the G-DAC is configured to perform the fractional-N frequency synthesis based on the digital control signal.

11. The PLL frequency synthesizer of claim 9, wherein the G-DAC is configured to perform the fractional-N frequency synthesis without using a frequency divider.

12. The PLL frequency synthesizer of claim 1, wherein the feedback path of the PLL frequency synthesizer does not include a frequency divider.

13. The PLL frequency synthesizer of claim 1, wherein the G-DAC consumes significantly less power than a DAC in a digital direct frequency synthesizer (DDFS) which operates full time.

14. The PLL frequency synthesizer of claim 1, wherein the G-DAC requires significantly lower sampling rate than a DAC in a DDFS which operates full time.

15. The PLL frequency synthesizer of claim 1, further comprising a charge pump and a low pass filter coupled between the phase-frequency detector and the VCO.

16. The PLL frequency synthesizer of claim 1, further comprising a set of output frequency dividers coupled to an output of the VCO and configured to divide the output clock of the VCO by a set of predetermined division factors.

17. The PLL frequency synthesizer of claim 1, further comprising:

a second DAC control module configured to generate a second periodic DAC control signal; and a second DAC module coupled to the second DAC control module to receive the second periodic DAC control signal; and wherein a period of the second periodic DAC control signal includes a third set of time intervals which comprises active control signals for controlling an operation of the second DAC module and a fourth set of time intervals which comprises a second signal value for disabling the second DAC module, and wherein the second DAC module is directly coupled to both the second DAC control module and the multiplexor.

* * * * *